(12) United States Patent  
Murata (10) Patent No.: US 6,716,067 B2  
(45) Date of Patent: Apr. 6, 2004

(54) MULTI-CONNECTOR FOR USE IN HIGH-SPEED COMMUNICATION APPARATUS AND METHOD FOR MOUNTING THE SAME MULTI-CONNECTOR INTO PRINTED BOARD

(75) Inventor: Yuichiro Murata, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/315,038

(22) Filed: Dec. 10, 2002

(65) Prior Publication Data

US 2003/0109152 A1 Jun. 12, 2003

(30) Foreign Application Priority Data

Dec. 11, 2001 (JP) .......................... 2001-377248

(51) Int. Cl.$^7$ ............................................... H01R 27/00
(52) U.S. Cl. ........................................ 439/660; 439/516
(58) Field of Search ................................. 439/660, 516, 439/108, 101, 74

(56) References Cited

U.S. PATENT DOCUMENTS

| 4,592,606 A | * | 6/1986 | Mudra | 439/516 |
| 4,689,023 A | * | 8/1987 | Strong et al. | 439/189 |
| 5,112,230 A | * | 5/1992 | DeSimone | 439/55 |
| 5,299,939 A | * | 4/1994 | Walker et al. | 439/74 |
| 5,387,126 A | * | 2/1995 | Austin et al. | 439/516 |
| 5,634,821 A | * | 6/1997 | Crane, Jr. | 439/660 |
| 5,641,309 A | * | 6/1997 | Crane, Jr. | 439/660 |

FOREIGN PATENT DOCUMENTS

| JP | 1-197977 | 8/1989 |
| JP | 5-62736 | 3/1993 |
| JP | 11-251005 | 9/1999 |

* cited by examiner

*Primary Examiner*—Gary F. Paumen  
(74) *Attorney, Agent, or Firm*—Leydig, Voit & Mayer, Ltd.

(57) ABSTRACT

In an electrical connector, a female terminal is inserted into a corresponding through-hole of a printed board, copper plating is divided into two copper plating parts having knife edge-like end portions, and land portion is also divided into two land parts having knife edge-like end portions. As a result, the copper plating parts are connected to two copper pattern parts through the separate land parts, respectively. The separate parts thus obtained form a signal portion and a ground portion, respectively. That is, the first copper plating part, the first land part, and the first copper pattern part constitute a signal portion, and the second copper plating part, the second land part, and the second copper pattern part constitute a ground portion.

8 Claims, 6 Drawing Sheets

MULTI-CONNECTOR FOR USE IN HIGH-SPEED COMMUNICATION APPARATUS AND METHOD FOR MOUNTING THE SAME MULTI-CONNECTOR INTO PRINTED BOARD

BACKGROUND OF THE INVENTION

1. Field of the Invention

The present invention relates to a multi-connector used in a high-speed communication apparatus for signal connection of the high-speed communication apparatus, and a method for mounting the multi-connector into a printed board.

2. Description of the Related Art

Figure 5A:
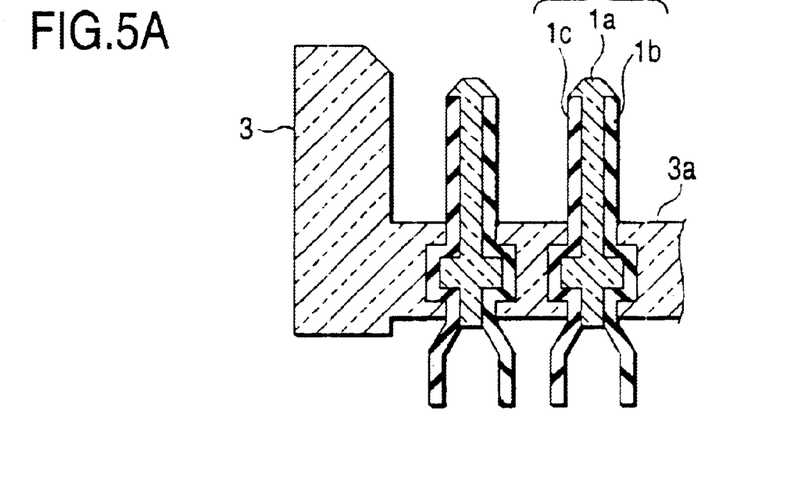
FIGS. 5A and 5B are sectional views of a male connector and a female connector, respectively, in a related-art multi-connector for use in a high-speed communication apparatus.
Figure 5B:
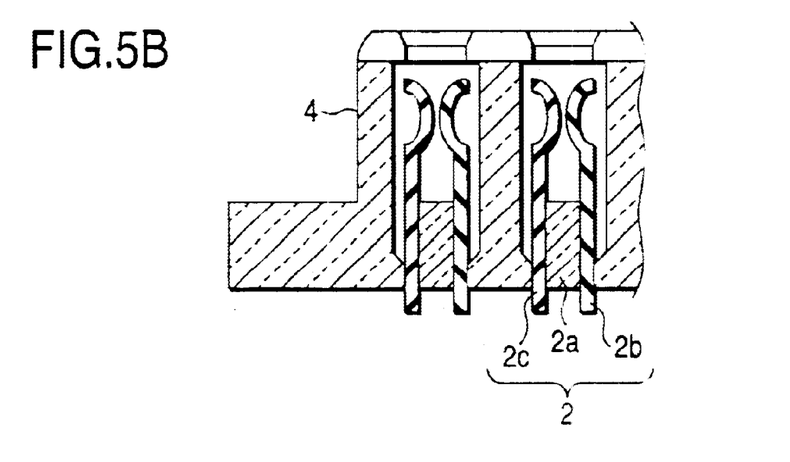
Figure 5C:
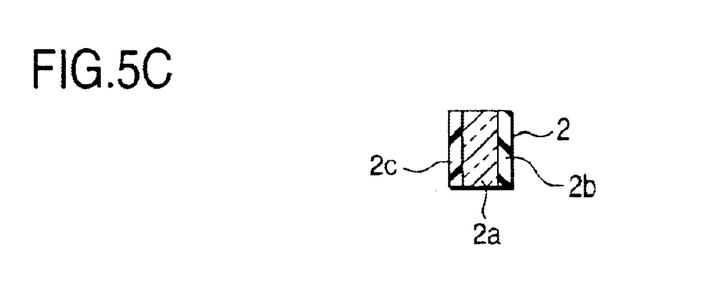
FIG. 5C is a bottom view of main part of FIG. 5B.

As a multi-connector in a high-speed communication apparatus, there is used a multi-connector constituted by a pair of male and female connectors in each of which a large number of terminals are arranged in parallel at intervals of a predetermined pitch and fixed in a connector housing. FIGS. 5A and 5B are sectional views of male and female connectors in a multi-connector for use in a high-speed communication apparatus, for example, as disclosed in Japanese Patent Laid-Open No. Hei. 62736. In addition, FIG. 5C is a bottom view showing main part of the female connector depicted in FIG. 5B.

In FIG. 5A, each male terminal 1 has a signal terminal part 1c, and a ground terminal part 1b paired with the signal terminal part 1c. In FIG. 5B, each female terminal 2 has a signal terminal part 2c, and a ground terminal part 2b paired with the signal terminal part 2c. These male terminals are arranged at intervals of a predetermined pitch and fixed in a common connector housing 3. These female terminals are arranged at intervals of a predetermined pitch and fixed in a common connector housing 4. Thus, a multi-connector is constituted by the male and female connectors paired with each other. Each male terminal 1 (each female terminal 2) is divided into two terminal parts extending axially, that is, a signal terminal part 1c (2c) and a ground terminal part 1b (2b) so that impedance matching between the terminal parts is perfect. The signal terminal part 1c (2c) and the ground terminal part 1b (2b) are isolated from each other by an electrical insulator 1a (2a) having a predetermined dielectric constant and a predetermined thickness to form a predetermined value of impedance between the signal terminal part 1c (2c) and the ground signal part 1b (2b). For example, an electrical insulator 0.5 mm thick is used to form impedance of 50Ω between the signal terminal part 1c (2c) and the ground signal part 1b (2b). Further, as shown in FIG. 5C which is a bottom view of main part of the female connector depicted in FIG. 5B, the electrical insulator 2a of the female terminal 2 has a width substantially equal to the distance between the signal terminal part 2c and the ground terminal part 2b.

Figure 6A:
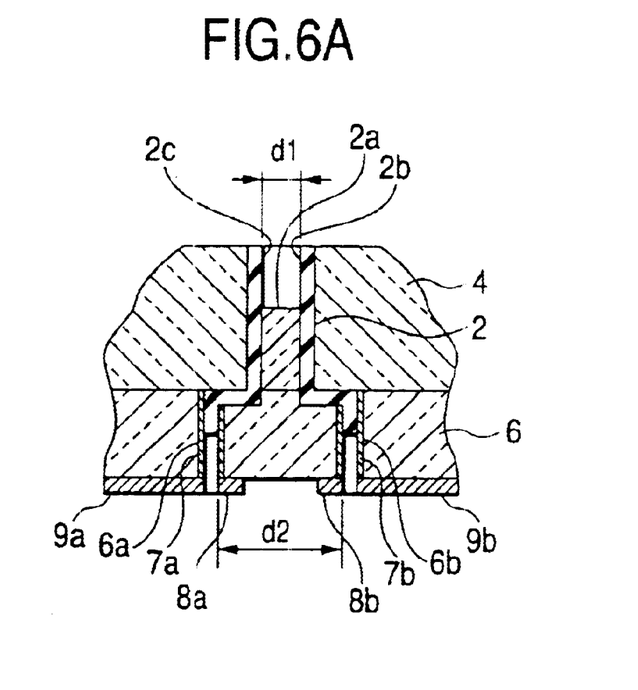
FIG. 6A is a sectional view showing connection between the multi-connector for use in the high-speed communication apparatus and a printed board.
Figure 6B:
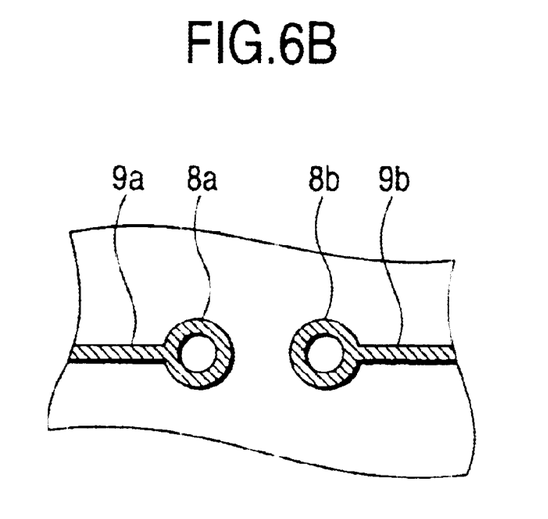
FIG. 6B is a bottom view of FIG. 6A.

In a high-speed communication apparatus, a multi-connector constituted by a pair of male and female connectors is used for signal connection to a printed board. For example, as shown in FIG. 6A which is a sectional view showing connection between the connector and the printed board, and FIG. 6B which is a bottom view of FIG. 6A, the female terminal 2 of the multi-connector is connected into the printed board 6. In FIGS. 6A and 6B, the signal terminal part 2c and the ground terminal part 2b as electric pins are connected into through-holes 6a and 6b, respectively, in the printed board 6. A copper plating 7a (7b), for example, 1 μm thick is applied to the inner circumference of each through-hole 6a (6b). A land portion 8a (8b) connected to the copper plating 7a (7b) is provided on the pattern wiring side of the printed board 6. That is, the copper plating 7a (7b) is connected to a copper pattern 9a (9b), for example, 12 μm thick through the copper portion 8a (8b).

For the multi-connector used in the high-speed communication apparatus and the method of mounting the multi-connector into the printed board, it is necessary to widen the distance between the signal terminal part and the ground terminal part in accordance with the distance between two corresponding through-holes. For example, in the multi-connector for use in high-speed communication apparatus, the distance d1 between the signal terminal part 2c and the ground terminal part 2b is about 0.5 mm but the distance d2 between the through holes 6a and 6b is widened to about 2 mm because the land portions 8a and 8b are provided on the pattern wiring side of the printed board 6. For this reason, characteristic impedance between the signal terminal part and the ground apparatus has a problem in degradation of electrical characteristics.

SUMMARY OF THE INVENTION

The invention is developed for solving the problem. An object of the invention is to provide a multi-connector for use in a high-speed communication apparatus and a method for mounting the multi-connector into a printed board, in which the distance between each signal terminal part and a corresponding ground terminal part in the multi-connector for use in the high-speed communication apparatus need not be widened in the place for connection into the printed board when the signal terminal part and the ground terminal part in the multi-connector for use in the high-speed communication apparatus are attached into the printed board, so that characteristic impedance between the two terminal parts can be restrained from varying.

According to a first aspect of the invention, there is provided a multi-connector for use in a high-speed communication apparatus, the multi-connector including a male connector and a female connector. In the male connector, a plurality of terminals are arranged in parallel at intervals of a predetermined pitch and fixed in a first connector housing. In the female connector paired with the male connector, a plurality of terminals are arranged in parallel at intervals of a predetermined pitch and fixed in a second connector housing. Each of terminals is divided into two terminal parts extending axially. The two terminal parts are isolated from each other by an electrical insulator having a predetermined dielectric constant and a predetermined thickness. Knife edge-like end portions are formed on both sides of the electrical insulator in each of terminal parts of at least one of the male and female connectors. Accordingly, the distance between the two terminal parts need not be widened in the place for connection into the board to be connected. Hence, the multi-connector for use in the high-speed communication apparatus can be obtained so that characteristic impedance between the two terminal parts can be restrained from varying.

According to a second aspect of the invention, there is provided a method for mounting a multi-connector for use in a high-speed communication apparatus into a printed board. The multi-connector includes a male connector and a female connector. In the male connector, a plurality of terminals are arranged in parallel at intervals of a predetermined pitch and fixed in a first connector housing. In the female connector paired with the male connector, a plurality of terminals are arranged in parallel at intervals of a predetermined pitch and fixed in a connector housing. Each of terminals divided into two terminal parts extending axially and isolated from each other by an electrical insulator having a predetermined dielectric constant and a predetermined thickness. Knife edge-like end portions formed on both sides of the electrical insulator in each of the terminal parts of at least one of the male and female connectors. The printed board includes electrically conducting portions, pattern wiring portions, and land portions. The electrically conducting portions formed by applying an electrically high conductive plating to through-holes formed in the printed board to be connected to the multi-connector. The land portions are provided on a pattern wiring portion side and through which the electrically conducting portions are connected to the pattern wiring portions, respectively. The method includes the steps of inserting the connector having the knife edge-like end portions on the both sides of the electrical insulator into corresponding one of the through-holes of the printed board and three separating steps. In the first separating step, corresponding one of the electrically conducting portions is separated into a first electrically conducting part and a second electrically conducting part by the knife edge-like end portions. In the second separating step, corresponding one of the land portions is separated into a first land part and a second land part by the knife edge-like portions. In the third separating step, corresponding one of the pattern wiring portions is separated into a first pattern wiring part and a second pattern wiring part. Accordingly, the distance between the two terminal parts need not be widened in the place for connection to the printed board. Hence, a method for mounting a multi-connector for use in a high-speed communication apparatus into a printed board can be obtained so that characteristic impedance between the two terminal parts can be restrained from varying.

According to a third aspect of the invention, there is provided a method for mounting a multi-connector for use in a high-speed communication apparatus into a printed board. The multi-connector includes a male connector and a female connector. In the male connector, a plurality of terminals are arranged in parallel at intervals of a predetermined pitch and fixed in a connector housing. In the female connector paired with the male connector, a plurality of terminals are arranged in parallel at intervals of a predetermined pitch and fixed in a connector housing. Each of terminals divided into two terminal parts extending axially and isolated from each other by an electrical insulator having a predetermined dielectric constant and a predetermined thickness. The electrical insulator of each of terminals of at least one of the connectors having a linear portion sandwiched between the two terminal parts so as to extend linearly. Knife edge-shaped end portions being formed at both ends of the linear portion. The printed board includes electrically conducting portions, pattern wiring portions, and land portions. The electrically conducting portions are formed by applying an electrically high conductive plating to each of through-holes formed in the printed board to be connected to the multi-connector. The land portions are provided on a pattern wiring portion side and through which the electrically conducting portions are connected to the pattern wiring portions, respectively. The method includes the steps of inserting each terminal having the knife edge-like end portions at the both ends of the linear portion of the electrical insulator into corresponding one of the through-holes of the printed board and four separating steps. In the first separating step, corresponding one of the electrically conducting portions is separated into a first electrically conducting part and a second electrically conducting part by the linear portion. In the second separating step, corresponding one of the land portions is separated into a first land part and a second land part by the linear portion. In the third separating step, corresponding one of the pattern wiring portions is separated into a first pattern wiring part and a second pattern wiring part. Accordingly, the distance between the two terminal parts need not be widened in the place for connection to the printed board, and the connection portion of the board to be connected can be cut into two parts along the shape of the linear portion so that the two parts can be electrically connected to the terminal parts. Hence, variation in characteristic impedance between the two terminal parts can be set to be substantially equal to zero, or crosstalk can be reduced to zero in the place for connection.

DETAILED DESCRIPTION OF THE PREFERRED EMBODIMENTS

Embodiment 1

Figure 1A:
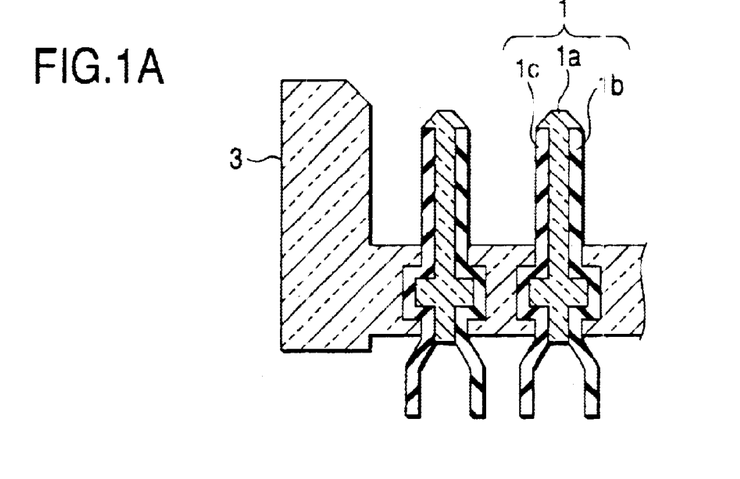
FIGS. 1A and 1B are sectional views of a male connector and a female connector, respectively, in a multi-connector for use in a high-speed communication apparatus according to Embodiment 1 of the invention.
Figure 1B:
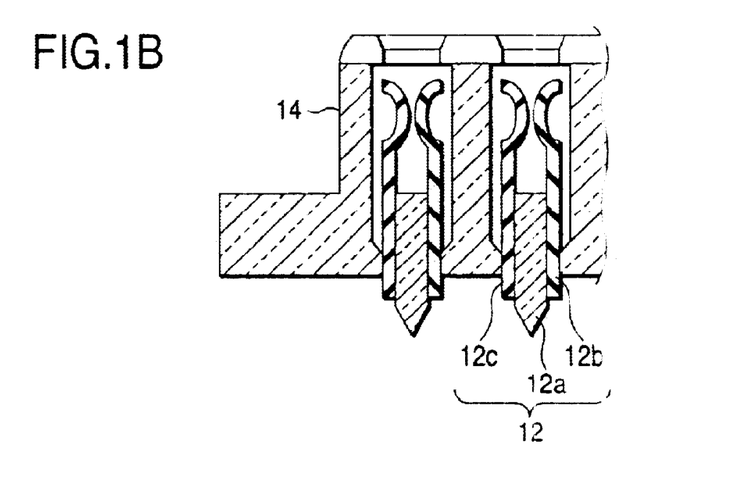

FIGS. 1A and 1B are sectional views of a male connector and a female connector, respectively, in a multi-connector for use in a high-speed communication apparatus according to an embodiment 1 of the invention. In the embodiment 1 of the invention, each male terminal 1 is formed in the same manner as the related-art male terminal 1 shown in FIG. 5A, but each female terminal 12 is different from the related-art female terminal 2 shown in FIG. 5B. In FIGS. 1A and 1B, each male terminal 1 (each female terminal 12) has a signal terminal part 1c (12c), and a ground terminal part 1b (12b) paired with the signal terminal part 1c (12c). The terminals 1 (12) are arranged at intervals of a predetermined pitch and fixed in a common connector housing 3 (14) to thereby form a male connector (female connector). The male and female connectors are paired with each other to constitute a multi-connector.

Each male terminal 1 (each female terminal 12) is divided into two terminal parts extending axially, that is, a signal terminal part 1c (12c) and a ground terminal part 1b (12b) so that impedance matching between the terminals is perfect. The two terminal parts are isolated from each other by an electrical insulator 1a (12a) having a predetermined dielectric constant and a predetermined thickness, such as an electrical insulator made of ceramics or epoxy resin with a thickness of 0.5 mm, so that impedance having a predetermined value such as impedance of 50Ω is formed between the two terminal parts.

Figure 1C:
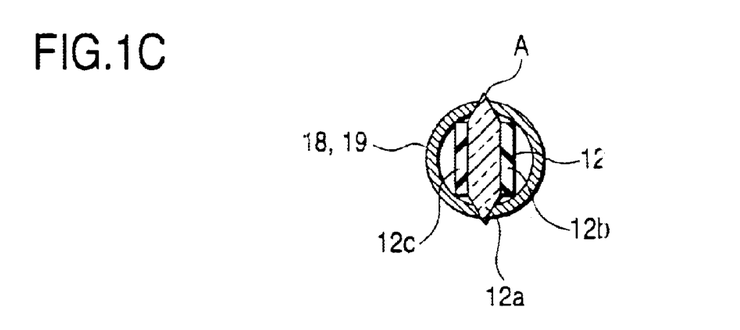
FIG. 1C is a bottom view of main part of FIG. 1B.

As shown in FIG. 1C which is a bottom view of main part of FIG. 1B, at a position where the electrical insulator 12a of the female terminal 12 is sandwiched between the signal terminal part 12c and the ground terminal part 12b, the electrical insulator 12a has a width substantially equal to the distance between the two terminal parts 12b and 12c. Further, both ends of the electrical insulator 12a are formed as knife edge-like end portions A so that a copper plating 18 applied to the inner circumference of a through-hole 17 and a land portion 19 connected to the copper plating 18 are divided into two parts with the knife edge-like end portions A when the electrical insulator 12a is attached into a printed board 16, which will be described later.

Figure 2A:
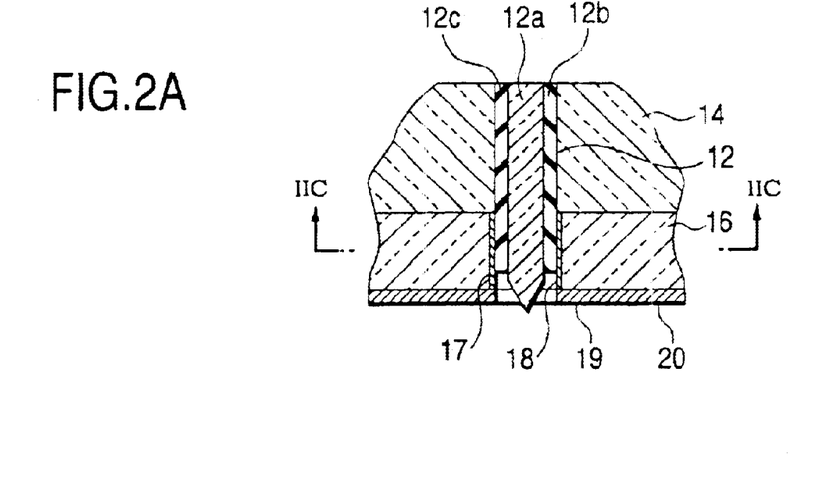
FIG. 2A is a sectional view showing connection between the multi-connector for use in the high-speed communication apparatus as shown in FIGS. 1A to 1C and a printed board.
Figure 2B:
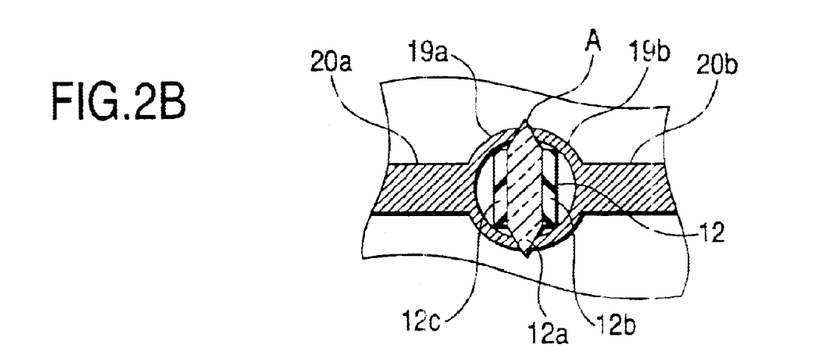
FIG. 2B is a bottom view of FIG. 2A.

FIG. 2A is a sectional view showing connection between the multi-connector used in the high-speed communication apparatus and the printed board. FIG. 2B is a bottom view of FIG. 2A. In FIGS. 2A and 2B, the through-holes 17 are provided in the printed board 16. The copper plating 18, for example, 1 μm thick, is applied to the inner circumference of each of the through-holes 17. The land portion 19 connected to each copper plating 18 is provided on the pattern wiring side of the printed board 16. Each copper plating 18 is connected to a copper pattern 20, for example, 12 μm thick through the land portions 19.

A method for connecting the female terminals 12 into the printed board 16 will be described below.

Figure 2C:
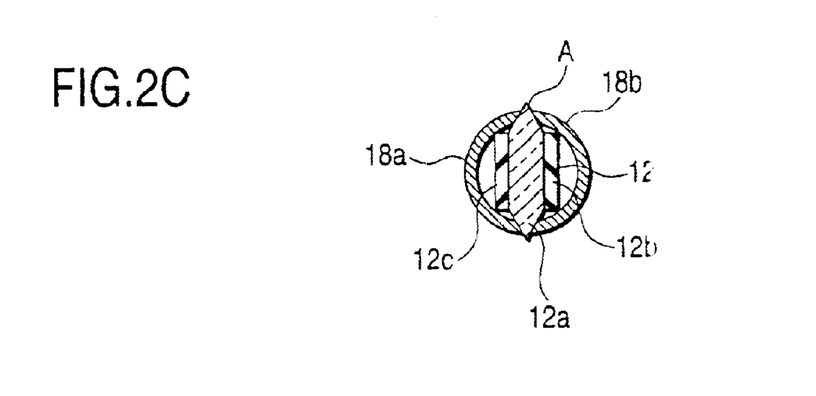
FIG. 2C is a sectional view of main part taken along the line IIC—IIC in FIG. 2A.

When each female terminal 12 is inserted into corresponding one of the through-holes 17 of the printed board 16, the copper plating 18 is separating into two copper plating parts 18a and 18b with the knife edge-like end portions A (see FIG. 2C which is a sectional view of main part taken along the line IIC—IIC in FIG. 2A). When each female terminal 12 is further inserted into the printed board 16, the land portion 19 is separated into two land parts 19a and 19b with the knife edge-like end portions A as shown in FIG. 2B. Hence, the copper plating parts 18a and 18b are connected to copper pattern parts 20a and 20b through the separate land parts 19a and 19b respectively. In this manner, the separate parts can be fanned for a signal portion and a ground portion, respectively. That is, the copper plating part 18a, the land part 19a and the copper pattern part 20a constitute a signal portion whereas the copper plating part 18b, the land part 19b and the copper pattern part 20b constitute a ground portion.

Accordingly, the distance between each signal terminal part and a corresponding ground terminal part in the multi-connector used in the high-speed communication apparatus need not be widened at a place for connection into the printed board when the signal terminal part and the ground terminal part in the multi-connector are attached into the printed board. Hence, a multi-connector for use in a high-speed communication apparatus and a method for mounting the multi-connector into a printed board can be obtained so that characteristic impedance between the signal terminal part and the ground terminal part can be restrained from varying.

Further, when each signal terminal part and a corresponding ground terminal part in the multi-connector used in the high-speed communication apparatus are inserted into corresponding one of the through-holes of the printed board, configuration is made so that the plating portions of the through-hole and the land portions are separated. Hence, the signal terminal part and the ground terminal part in the multi-connector used in the high-speed communication apparatus can be prevented from being displaced from the connection portion of the printed board, so that the signal portion can be prevented from being short-circuited to the ground portion.

Although the embodiment has been described on the case where the separate parts are formed for a signal portion and a ground portion respectively, the invention may be applied to the case where the separate parts are used for two signal portions respectively. In this case, crosstalk from other signal lines can be reduced at the place for connection into the board to be connected, or variation in characteristic impedance between differential lines constituted by two signal terminal parts can be reduced.

Further, in the embodiment, the width of the electrical insulator of each female terminal is substantially equal to the distance between the signal terminal part and the ground terminal part in the condition that the electrical insulator is sandwiched between the two terminal parts. Both sides of the electrical insulator are formed as knife edge-like end portions A. Each male terminal maybe formed in the same manner as the female terminal.

Embodiment 2

Figure 3A:
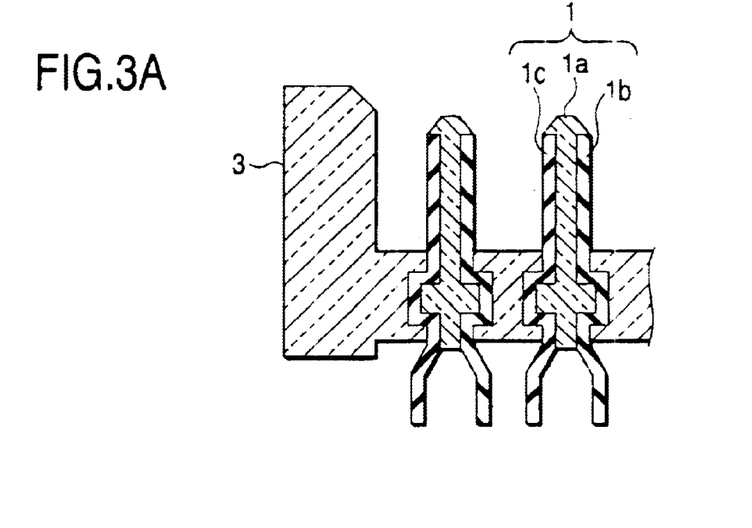
FIGS. 3A and 3B are sectional views of a male connector and a female connector, respectively, in a multi-connector for use in a high-speed communication apparatus according to Embodiment 2 of the invention.
Figure 3B:
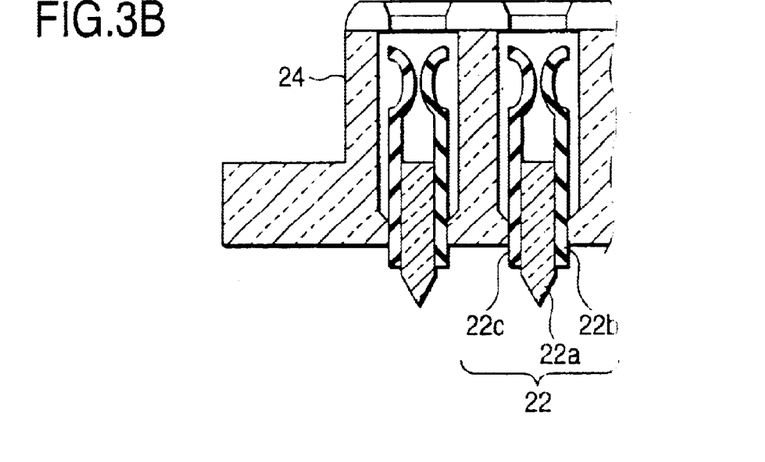

FIGS. 3A and 3B are sectional views of a male connector and a female connector, respectively, in a multi-connector used in a high-speed communication apparatus according to an embodiment 2 of the invention. In the embodiment 2 of the invention, each male terminal 1 is formed in the same manner as in the related-art male terminal 1 shown in FIG. 5A, but the female terminal 22 is formed in a different manner from the related-art female terminal 2 shown in FIG. 5B. In FIGS. 3A and 3B, each male terminal 1 (each female terminal 22) has a signal terminal part 1c (22c), and a ground terminal part 1b (22b) paired with the signal terminal part 1c (22c) The terminals 1 (22) are arranged at intervals of a predetermined pitch and fixed in a common connector housing 3 (24) to thereby form a male connector (female connector). The male and female connectors are paired with each other to constitute a multi-connector.

Each male terminal 1 (each female terminal 22) is divided into two terminal parts extending axially, that is, a signal terminal part 1c (22c) and a ground terminal part 1b (22b) so that impedance matching between the terminals is perfect. The two terminal parts are isolated from each other by an electrical insulator 1a (22a) having a predetermined dielectric constant and a predetermined thickness, such as an electrical insulator made of ceramics or epoxy resin with a thickness of 0.5 mm, so that impedance having a predetermined value such as impedance of 50Ω is formed between the two terminal parts.

Figure 3C:
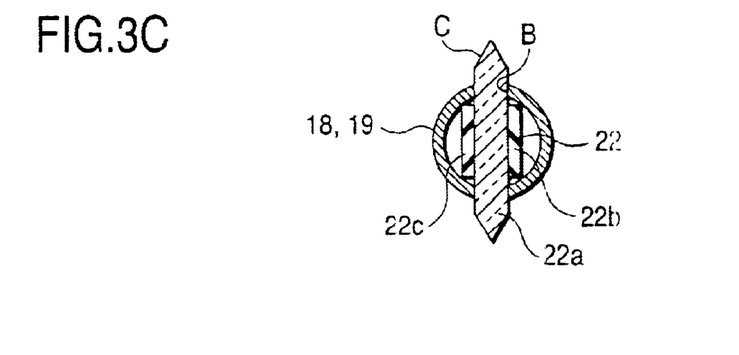
FIG. 3C is a bottom view of main part of FIG. 3B.

As shown in FIG. 3C which is a bottom view of main part of FIG. 3B, the electrical insulator 22a of each female terminal 22 has a sectionally linear portion B sandwiched between the signal terminal part 22c and the ground terminal part 22b so as to extend linearly to both sides. The both ends of the sectionally linear portion B are formed as knife edge-like end portions C so that a copper plating 18 applied to the inner circumference of a through-hole 17 and a land portion 19 connected to the copper plating 18 are cut into two parts when the electrical insulator 22a is attached into a printed board 16 which will be described later.

Figure 4A:
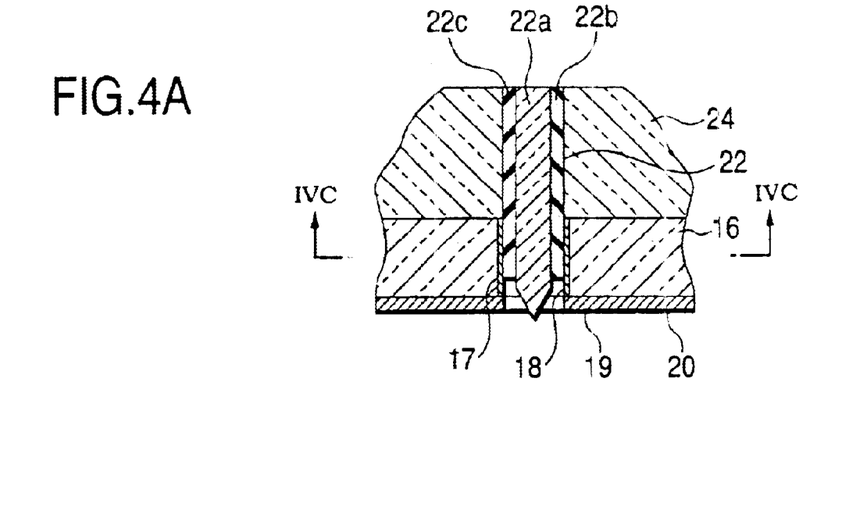
FIG. 4A is a sectional view showing connection between the multi-connector for use in the high-speed communication apparatus as shown in FIGS. 3A to 3C and a printed board.
Figure 4B:
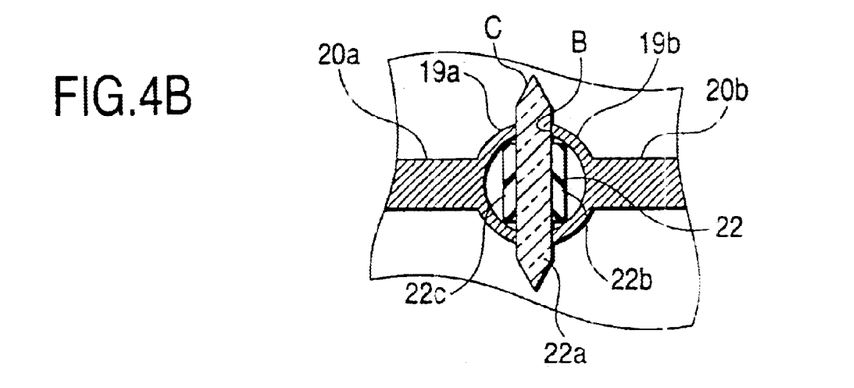
FIG. 4B is a bottom view of FIG. 4A.

FIG. 4A is a sectional view showing connection between the multi-connector used in the high-speed communication apparatus and the printed board. FIG. 4B is a bottom view of FIG. 4A. Incidentally, the printed board is formed in the same manner as the printed board 16 shown in FIGS. 2A, but only the female terminal 22 is different from the female terminal 12 shown in FIG. 2A.

A method for attaching each female terminal 22 into the printed board 16 will be described below. When each female terminal 22 is inserted into corresponding one of the through-holes 17 of the printed board 16, the printed board 16 is cut with the end portions C so that the copper plating 18 is separated into two copper plating parts 18a and 18b with the linear portion B (see FIG. 4C which is a sectional view of main part taken along the line IVC—IVC in FIG. 4A). When the female terminal 22 is further inserted into the printed board manner, the separate parts can be formed for a signal portion and a ground portion, respectively. That is, the copper plating part 18a, the land part 19a and the copper pattern part 20a constitute a signal portion whereas the copper plating part 18b, the land part 19b and the copper pattern part 20b constitute a ground portion.

Figure 4C:
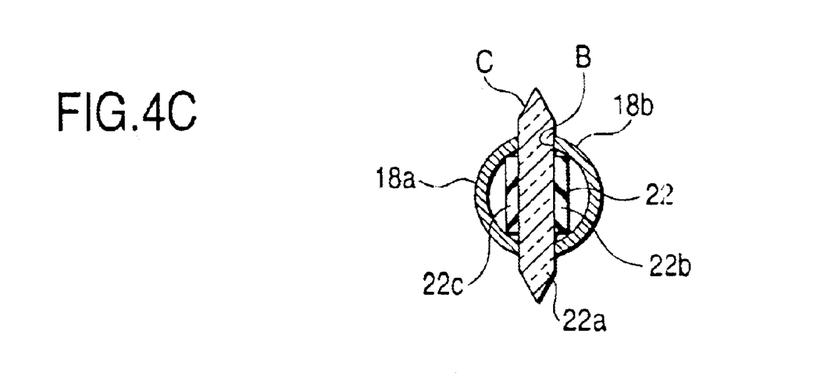
FIG. 4C is a sectional view of main part taken along the line IVC—IVC in FIG. 4A.

Accordingly, the distance between each signal terminal part and a corresponding ground terminal part in the multi-connector for use in the high-speed communication apparatus need not be widened at a place for connection into the printed board when the signal terminal part and the ground terminal part in the multi-connector for use in the high-speed communication apparatus are attached into the printed board. Hence, a multi-connector for use in a high-speed communication apparatus and a method for mounting the multi-connector into a printed board can be obtained so that characteristic impedance between the signal and ground terminal parts can be restrained from varying. Although FIGS. 2A to 2C have shown the case where both sides of the signal terminal part as an electric pin are not aligned with both sides of the signal portion of the through-hole (because the both sides of the signal portion of the through-hole are cut along the knife edge-like end portions A), variation in characteristic impedance between the printed board and the multi-connector for use in the high-speed communication apparatus can be set to be substantially equal to zero in the case where the both sides of the signal terminal part are aligned with the both sides of the signal portion of the through-hole (because the both sides of the signal portion of the through-hole are cut along the sectionally linear portion B) as shown in FIGS. 4A to 4C.

Further, the embodiment has been described on the case where the electrical insulator of each female terminal has a sectionally linear portion B sandwiched between the signal terminal part and the ground terminal part so as to extend linearly to both sides, and knife edge-like end portions C formed at both ends of the sectionally linear portion B. Each male terminal may be formed in the same manner as the female terminal.

What is claimed is:

1. A multi-connector for high-speed communication apparatus, the multi-connector comprising:
    a male connector including a plurality of terminals arranged in parallel, at intervals having a pitch, and fixed in a first connector housing; and
    a female connector, paired with the male connector, one of the male and female connectors including a plurality of terminals arranged in parallel at intervals having the pitch, and fixed in a second connector housing, wherein each of the terminals is divided into first and second terminal parts extending axially;
    the first and second terminal parts are electrically isolated from each other by an electrical insulator having a dielectric constant and a thickness; and
    each of the first and second terminal parts has knife edge-like end portions on opposite sides of the electrical insulator in each of terminal parts of at least one of the male and female connectors, the knife edge-like portions separating and electrically isolating parts of electrical conductors in holes in a printed circuit board and on the printed circuit board upon mounting of the connector including the plurality of terminals on the printed circuit board.

2. The multi-connector according to claim 1, wherein the electrical insulator has a width substantially equal to a distance between the two terminal parts when the electrical insulator is sandwiched between the two terminal parts.

3. The multi-connector according to claim 1, wherein
    the electrical insulator has a linear portion sandwiched between the two terminal parts and extending linearly; and
    the knife edge-like end portions are located at opposite ends of the linear portion.

4. The multi connector according to claim 1, wherein the first and second terminal parts extending axially are a signal terminal part and a ground terminal part, respectively.

5. The multi-connector according to claim 1, wherein the first and second terminal parts extending axially are signal terminal parts for differential lines, respectively.

6. The multi-connector according to claim 1, wherein the connector including the plurality of terminals is the female connector.

7. A method for mounting a multi-connector for a high-speed communication apparatus into a printed board,
    the multi-connector including:
        a male connector including a plurality of terminals arranged in parallel at intervals having a pitch and fixed in a first connector housing; and
        a female connector paired with the male connector, one of the male and female connectors having a plurality of terminals arranged in parallel at intervals having the pitch and fixed in a connector housing, each terminal being divided into two terminal parts extending axially and isolated from each other by an electrical insulator having a dielectric constant and a thickness, knife edge-like end portions being located on opposite sides of the electrical insulator in each of the terminal parts of at least one of the male and female connectors,
    the printed board including:
        electrically conducting portions including an electrically conductive plating in through-holes in the printed board for connection to the multi-connector;
        pattern wiring portions; and
        land portions on a pattern wiring portion side and through which the electrically conducting portions are respectively connected to the pattern wiring portions,
    the method comprising:
        inserting the connector having the knife edge-like end portions on opposite sides of the electrical insulator into a corresponding one of the through-holes of the printed board;
        separating a corresponding one of the electrically conducting portions into a first electrically conducting part and a second electrically conducting part electrically isolated from the first electrically conducting part with the knife edge-like end portions;

separating a corresponding one of the land portions into a first land part and a second land part electrically isolated from the first land part with the knife edge-like portions; and separating a corresponding one of the pattern wiring portions into a first pattern wiring part and a second pattern wiring part electrically isolated from the first pattern wiring part.

8. A method for mounting a multi connector for a high-speed communication apparatus into a printed board, the multi-connector including:
- a male connector including a plurality of terminals arranged in parallel at intervals having a pitch and fixed in a connector housing; and
- a female connector paired with the male connector, one of the male and female connectors having a plurality of terminals arranged in parallel at intervals having the pitch and fixed in a connector housing, each terminal being divided into two terminal parts extending axially and isolated from each other by an electrical insulator having a dielectric constant and a thickness, the electrical insulator of each of the terminals of at least one of the connectors having a linear portion sandwiched between the two terminal parts and extending linearly, knife edge-shaped end portions being located at both ends of the linear portion, the printed board including:
- electrically conducting portions including an electrically conductive plating in each of through-holes in the printed board for connection to the multi-connector;
- pattern wiring portions; and
- land portions on a pattern wiring portion side and through which the electrically conducting portions are respectively connected to the pattern wiring portions, the method comprising:
- inserting each terminal having the knife edge-like end positions at opposite ends of the linear portion of the electrically insulator into a corresponding one of the through-holes of the printed board;
- separating a corresponding one of the electrically conducting portions into a first electrically conducting part and a second electrically conducting part electrically isolated from the first electrically conducting part with the linear portion;
- separating a corresponding one of the land portions into a first land part and a second land part electrically isolated from the first land part with the linear portion; and
- separating a corresponding one of the pattern wiring portions into a first pattern wiring part and a second pattern wiring part electrically isolated from the first pattern wiring part.

* * * * *